(12) United States Patent
Hsu (10) Patent No.: US 10,446,658 B2
(45) Date of Patent: Oct. 15, 2019

(54) TRENCH POWER SEMICONDUCTOR DEVICE AND MANUFACTURING METHOD THEREOF

(71) Applicant: SUPER GROUP SEMICONDUCTOR CO., LTD., Hsinchu County (TW)

(72) Inventor: Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 14 days.

(21) Appl. No.: 15/641,455

(22) Filed: Jul. 5, 2017

(65) Prior Publication Data

US 2018/0076297 A1 Mar. 15, 2018

(30) Foreign Application Priority Data

Sep. 9, 2016 (TW) .............................. 105129317 A (51) Int. Cl.
*H01L 29/49* (2006.01)
*H01L 21/28* (2006.01)
*H01L 29/06* (2006.01)
*H01L 29/10* (2006.01)
*H01L 29/423* (2006.01)
*H01L 29/51* (2006.01)
*H01L 29/78* (2006.01)

(52) U.S. Cl.
CPC .... *H01L 29/4925* (2013.01); *H01L 21/28035* (2013.01); *H01L 21/28158* (2013.01); *H01L 29/0646* (2013.01); *H01L 29/1095* (2013.01); *H01L 29/42368* (2013.01); *H01L 29/42376* (2013.01); *H01L 29/512* (2013.01); *H01L 29/513* (2013.01); *H01L 29/518* (2013.01); *H01L 29/7813* (2013.01); *H01L 21/28114* (2013.01)

(58) Field of Classification Search
CPC ........... H01L 29/4925; H01L 21/28035; H01L 29/0646; H01L 29/1095; H01L 29/42368; H01L 21/28158; H01L 29/42376; H01L 29/512; H01L 29/513; H01L 29/518; H01L 29/7813
USPC ........................................................ 257/330
See application file for complete search history.

(56) References Cited

U.S. PATENT DOCUMENTS

| | | | |
|---|---|---|---|
| 6,387,758 B1 * | 5/2002 | Yu | H01L 29/66666 257/E21.41 |
| 6,566,708 B1 * | 5/2003 | Grover | H01L 29/402 257/330 |
| 7,361,555 B2 * | 4/2008 | Koops | H01L 29/407 438/268 |

FOREIGN PATENT DOCUMENTS

| | | |
|---|---|---|
| TW | M480763 U | 6/2014 |
| TW | 201543686 A | 11/2015 |

* cited by examiner

*Primary Examiner* — Tucker J Wright
*Assistant Examiner* — Sue Tang
(74) *Attorney, Agent, or Firm* — Li & Cai Intellectual Property (USA) Office (57) ABSTRACT

A trench power semiconductor device and a manufacturing method thereof are provided. The trench power semiconductor device includes a substrate, an epitaxial layer disposed on the substrate, and a gate structure. The epitaxial layer has at least one trench formed therein, and the gate structure is disposed in the trench. A gate structure includes a lower doped region and an upper doped region disposed above the lower doped region to form a PN junction. The concentration of the impurity decreases along a direction from a peripheral portion of the upper doped region toward a central portion of the upper doped region.

5 Claims, 12 Drawing Sheets

TRENCH POWER SEMICONDUCTOR DEVICE AND MANUFACTURING METHOD THEREOF

BACKGROUND

1. Technical Field

The present disclosure is related to a power semiconductor and a manufacturing method thereof, and in particular, to a trench power transistor and a manufacturing method thereof.

2. Description of Related Art

Current power metal-oxide-semiconductor field-effect transistors (power MOSFET) are designed to have a vertical structure to improve the packing density. The working loss of power MOSFFT is categorized into switching loss and conducting loss. In addition, the intrinsic gate-to-drain capacitance (Cgd) is one of the important parameters affecting switching loss. When the intrinsic gate-to-drain capacitance is too high, the switching loss increases, which may limit the switching speed of the power trench MOSFET and may lead to the trench power MOSFET being unfavorable to be implemented in high frequency circuits.

SUMMARY

The object of the present disclosure is to provide a trench power semiconductor device and a manufacturing method thereof, which can decrease the effective capacitance between the gate and the drain by using a gate having a PN junction formed therein.

In order to achieve the aforementioned object, according to an embodiment of the present disclosure, a manufacturing method of a trench power semiconductor device is provided. The manufacturing method includes forming an epitaxial layer on a substrate; forming a body region into the epitaxial layer; and forming a trench in the epitaxial layer. Then, an initial gate structure is formed into the trench. The initial gate structure includes a gate insulating layer covering the trench, a laminated layer covering the gate insulating layer corresponding to the lower part of the trench, a first heavily doped semiconductor structure extending from the lower part of the trench to the upper part of the trench, and two second heavily doped semiconductor structures disposed on the laminated layer. Each of the two second heavily doped semiconductor structures is individually disposed between the gate insulating layer and the first heavily doped semiconductor structure. The first heavily doped semiconductor structure and the second heavily doped semiconductor structure have a first conductive impurity and a second conductive impurity, respectively. Then, a doping process is performed, in which a second conductive impurity is implanted into the body region to form a first surface doped region and to form a second surface doped region on the top of the first heavily doped semiconductor structure simultaneously. Afterwards, a thermal diffusion process is performed, so that the first surface doped region forms a source region, and a gate is formed in the trench. In addition, the gate includes a lower doped region surrounded by the laminated layer, and an upper doped region on the laminated layer and the lower doped region, and a PN junction is formed between the lower doped region and the upper doped region.

In order to achieve the aforementioned object, according to another embodiment of the present disclosure, a trench power semiconductor device is provided. The trench power semiconductor device includes a substrate, an epitaxial layer and a gate structure. The epitaxial layer is disposed on the substrate, and has a trench. The gate structure is disposed in the trench, and includes a gate insulating layer, a laminated layer and a gate. The gate insulating layer covers an inside wall surface of the trench. The laminated layer covers the gate insulating layer corresponding to the lower part of the trench. The gate is disposed in the trench, and separated from the laminated layer and the epitaxial layer by the gate insulating layer. The gate includes an upper doped region on the laminated layer and a lower doped region surrounded by the laminated layer, a PN junction is formed between the upper doped region and the lower doped region, and the impurity concentration of the upper doped region decreases along the direction from the peripheral portion of the upper doped region to the central portion of the upper doped region.

To sum up, in the trench power semiconductor device and the manufacturing method thereof in accordance with the present disclosure, the PN junction can be formed in the gate. Since a junction capacitance (Cj) of the PN junction is generated under reverse bias, and the junction capacitance is in series with the parasitic capacitance (Cp) between the gate and the drain, the effective capacitance (Cgd) of gate-to-drain can be reduced. On the other hand, in the manufacturing method of the trench power semiconductor device, structures in the trench are doped during performing of the source doping process. Afterwards, the thermal diffusion process is performed, so as to simultaneously form the source region and the gate with a PN junction. Therefore, the diffusion of the conductive impurities in the upper doped region and the lower doped region of the gate, which causes the lack of the PN junction in the gate and poor characteristics of devices due to repeated thermal diffusion processes, can be prevented.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

Figure 1:
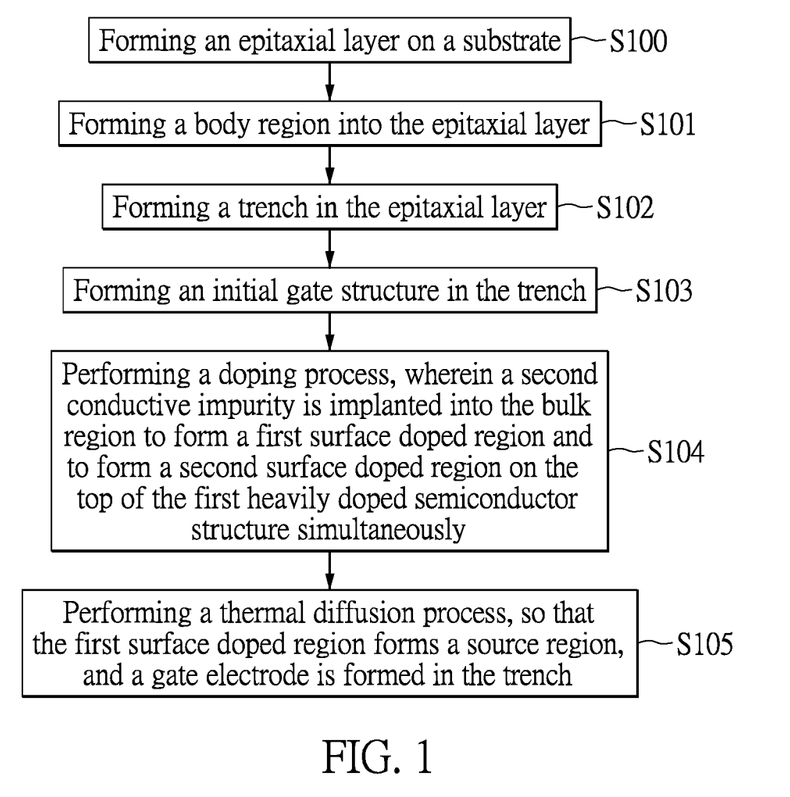
FIG. 1 is a flow diagram of a manufacturing method of a trench power semiconductor device according to an exemplary embodiment of the present disclosure.

FIG. 1 shows a flow diagram of a manufacturing method of a trench power semiconductor device according to an exemplary embodiment of the present disclosure. Referring to FIGS. 2A-2J, which individually show local sectional views of a trench power semiconductor device in each step of the manufacturing method according to an exemplary embodiment of the present disclosure.

Figure 2A:
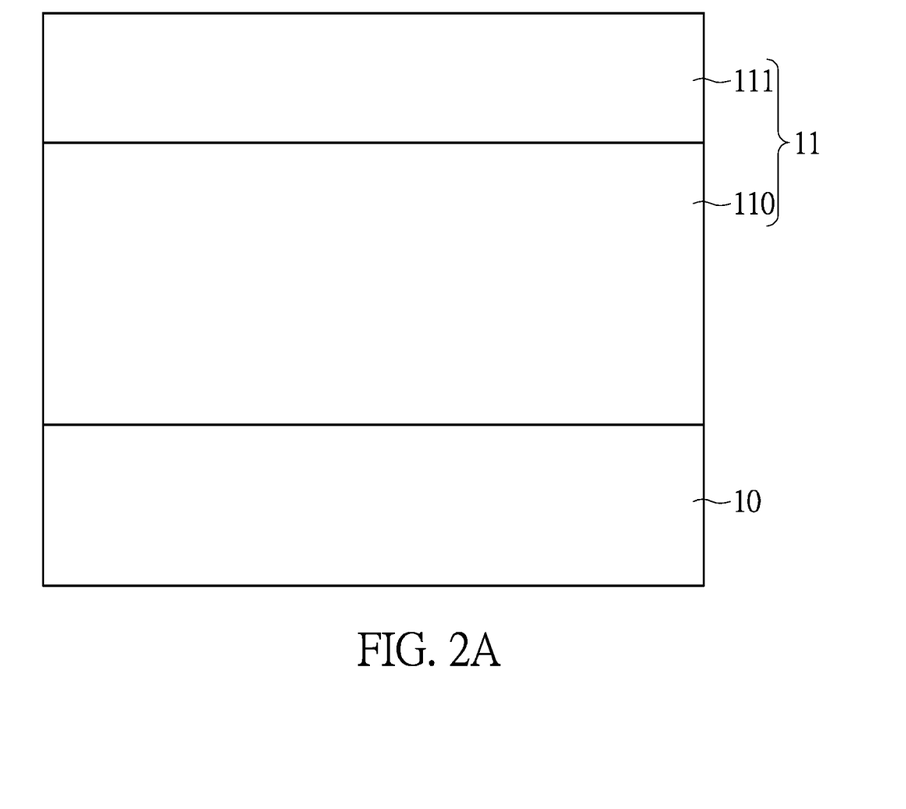
FIGS. 2A-2J are diagrams individually showing local sectional views of a trench power semiconductor device in each step of the manufacturing method according to an exemplary embodiment of the present disclosure.

In step S100, an epitaxial layer 11 is formed on a substrate 10, as shown in FIG. 2A. FIG. 2A illustrates the substrate 10, and the epitaxial layer 11 is formed on the substrate 10. The substrate 10 may exemplarily be a silicon substrate having a first heavily doped region with high doping concentration as a drain of the trench power MOSFET, while the epitaxial layer 11 is provided with low doping concentration.

The substrate 10 has a first conductive impurity with high concentration, so as to form the first heavily doped region. The first heavily doped region is used as the drain of the trench power MOSFET, and the first heavily doped region can be distributed at a local region or a whole region of the substrate 10. In accordance with the present embodiment, the first heavily doped region is distributed in the whole region of the substrate 10, but the present embodiment is not limited thereto. The said first conductive impurity may be N-type or P-type conductive impurities. If the substrate 10 is a silicon substrate, the N-type conductive impurities may be Group VA atoms such as phosphorus or arsenic, and the P-type conductive impurities may be Group III atoms such as boron, aluminum or gallium.

If the trench power MOSFET is N-type, the substrate 10 is doped with N-type conductive impurities. Similarly, if the trench power MOSFET is P-type, the substrate 10 is doped with P-type conductive impurities. The N-type trench power MOSFET is illustrated in the embodiment of the present disclosure.

The epitaxial layer 11 is formed on the substrate 10 and doped with a lower concentration of the first conductive impurity. That is, taking the N-type trench power MOSFET (NMOS) for example, the substrate 10 is a heavily N-type doped (N+) substrate and the epitaxial layer 11 is a lightly N-type doped (N−) layer. On the contrary, taking the P-type trench power MOSFET (PMOS) for example, the substrate 10 is a heavily P-type doped (P+) substrate and the epitaxial layer 11 is a lightly P-type doped (P−) layer.

In step S101, a body region 111 is formed in the epitaxial layer 11 and disposed at a side away from the substrate 10, as shown in FIG. 2A. In addition, the region excluding the body region 111 in the epitaxial layer 11 forms a drift region 110 of the trench power semiconductor device.

According to the present embodiment, the body-doping process and the body-thermal diffusion process are performed in advance, so that the body region 111 is formed in the epitaxial layer 11. This is to prevent the doped structure in the gate structure from being affected by the body region during the thermal diffusion process.

Figure 2B:
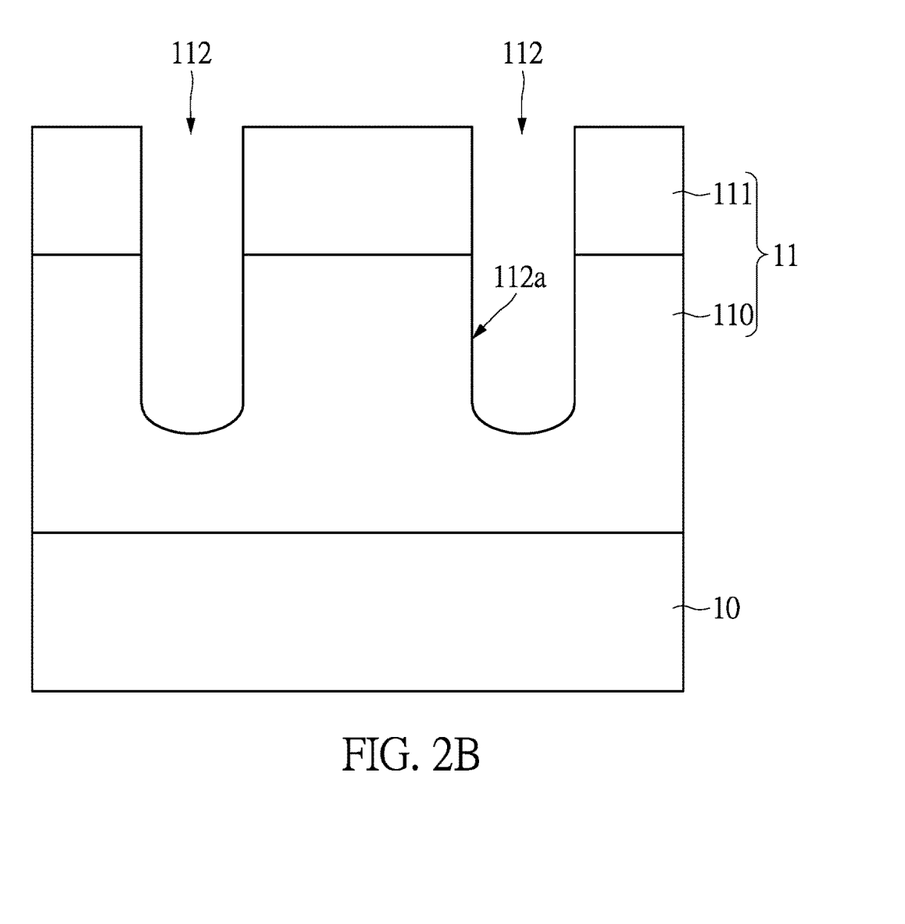

Afterwards, the trench is formed in the epitaxial layer in step S102. The trench 112 of the present disclosure is a deep trench, as shown in FIG. 2B. The trench 112 extends downwardly from the surface of the epitaxial layer 11 to the drift region 110 and particularly, over the body region 111, such that the bottom of the trench 112 nears the substrate 10.

More particularly, in the step for forming the trench 112, a mask (not shown) is used to define the positions of the gate structure in advance, and the trench 112 can be formed in the epitaxial layer 11 by performing dry etching or wet etching.

Then, the initial gate structure is formed in the trench in step S103. FIGS. 2C-2H illustrate the detail processes of forming the initial gate structure of the embodiment of the present disclosure.

Figure 2C:
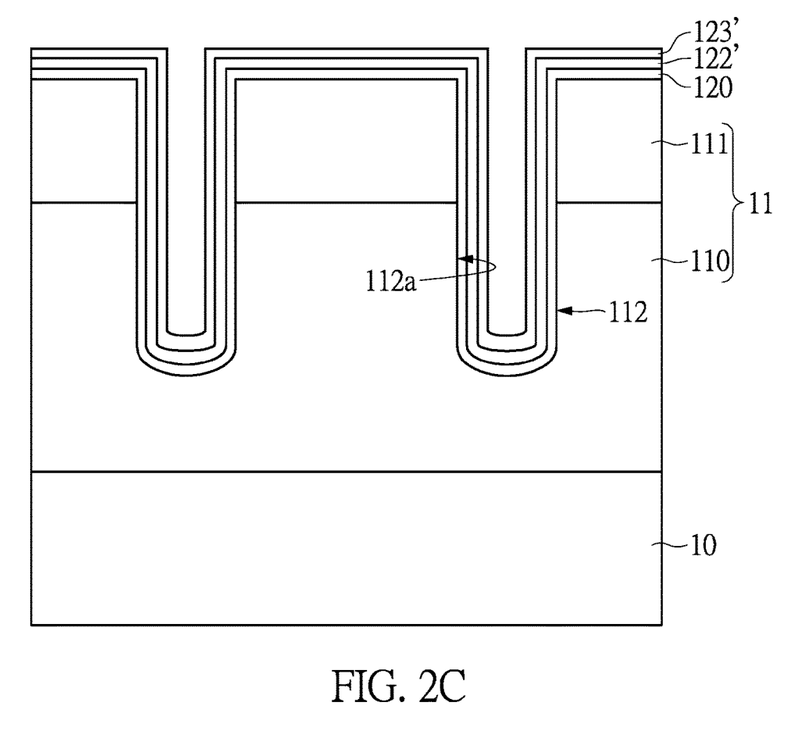

Firstly, the gate insulating layer 120, a first initial dielectric layer 122' and a second initial dielectric layer 123' are sequentially formed in the inside wall surface 112a of the trench 112, as shown in FIG. 2C. Particularly, the gate insulating layer 120, the first initial dielectric layer 122' and the second initial dielectric layer 123' cover the whole surface of the epitaxial layer 11 and the inside wall surface 112a of the trench 112.

In addition, the materials of which the first initial dielectric layer 122' is composed are different from the materials of which the second initial dielectric layer 123' and the gate insulating layer 120 are composed. For instance, the materials of which the gate insulating layer 120 and the second initial dielectric layer 123' are composed may be oxide, such as silicon oxide; the materials of which the first initial dielectric layer 122' is composed may be nitride, such as silicon nitride. Specifically, the materials of the gate insulating layer 120, the first initial dielectric layer 122' and the second initial dielectric layer 123' not limited to that disclosed in the present disclosure, as long as the second initial dielectric layer 123' and the first initial dielectric layer 122' are provided with high etch selectivity therebetween, and the first initial dielectric layer 122' and the gate insulating layer 120 are provided with high etch selectivity therebetween, so that selective etching can be performed in following processes.

The aforementioned etch selectivity means the etching ratio between two different materials (e.g. the first initial dielectric layer 122' and the second initial dielectric layer 123', or the gate insulating layer 120 and the first initial dielectric layer 122') under the same etching conditions. Since the etch selectivity between the second initial dielectric layer 123' and the first initial dielectric layer 122' is high, the first initial dielectric layer 122' is not removed during the etch process for removing the second initial dielectric layer 123'. Similarly, since the first initial dielectric layer 122' and the gate insulating layer 120 are provided with the high etch selectivity therebetween, the gate insulating layer 120 is not removed when performing the etch process to eliminate the first initial dielectric layer 122'.

Figure 2D:
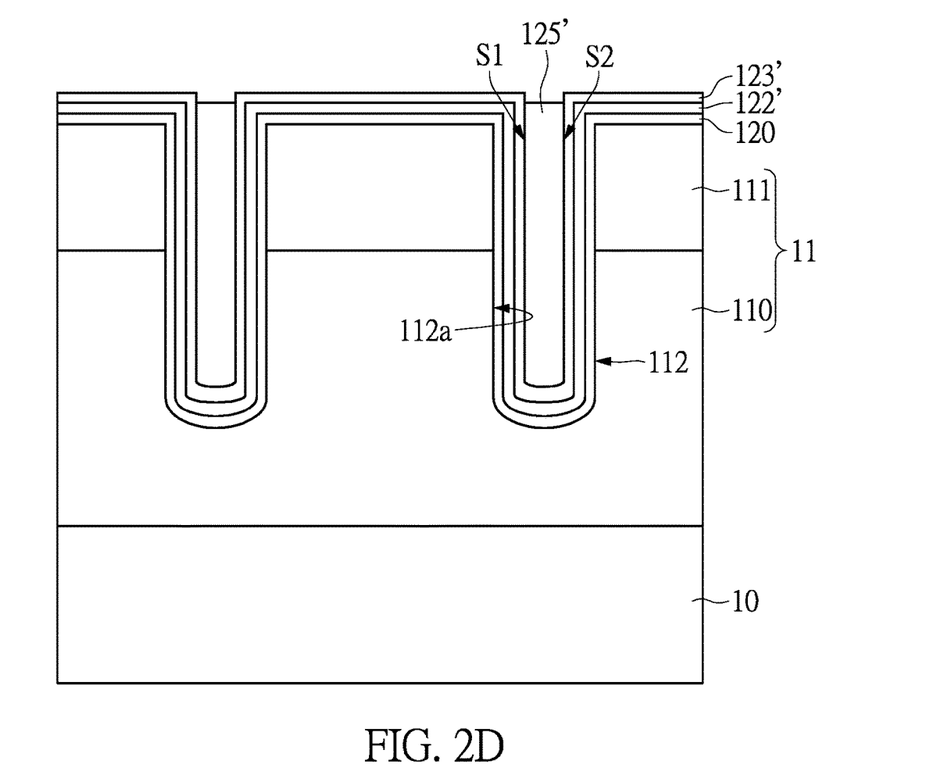

Then, referring to FIG. 2D, the first heavily doped semiconductor structure 125' is formed in the trench 112, and extends from the upper part to the lower part of the trench 112.

In one embodiment, the first conductive semiconductor material is formed on the second initial dielectric layer 123' in advance, then filled into the trench 112. The first conductive semiconductor material may be the doped polycrystalline silicon (poly-Si) containing conductive impurities. The method for forming the first conductive semiconductor material may be the in-situ doping CVD process. In another embodiment, the intrinsic polycrystalline silicon (poly-Si) is deposited, followed by performing the ion implantation to implant the impurities into the polycrystalline silicon. Afterwards, the thermal drive-in process is performed, thereby finishing the formation of the first conductive semiconductor material.

Then, the first conductive semiconductor material on the epitaxial layer 11 is removed by etching back, which leaves the first conductive semiconductor material in the trench 112 to form the first heavily doped semiconductor structure 125'. The first heavily doped semiconductor structure 125' has a first side S1 and a second side S2 facing the first side S1.

The first heavily doped semiconductor structure 125' includes the first conductive impurity, which can be N-type impurities or P-type impurities. Particularly, when the desired trench power semiconductor device is N-type MOSFET, the first heavily doped semiconductor structure 125' is doped with P-type impurities so as to form the P-type semiconductor structure. When the trench power semiconductor device is P-type MOSFET, the first heavily doped semiconductor structure 125' is doped with N-type impurities so as to form the N-type semiconductor structure.

Figure 2E:
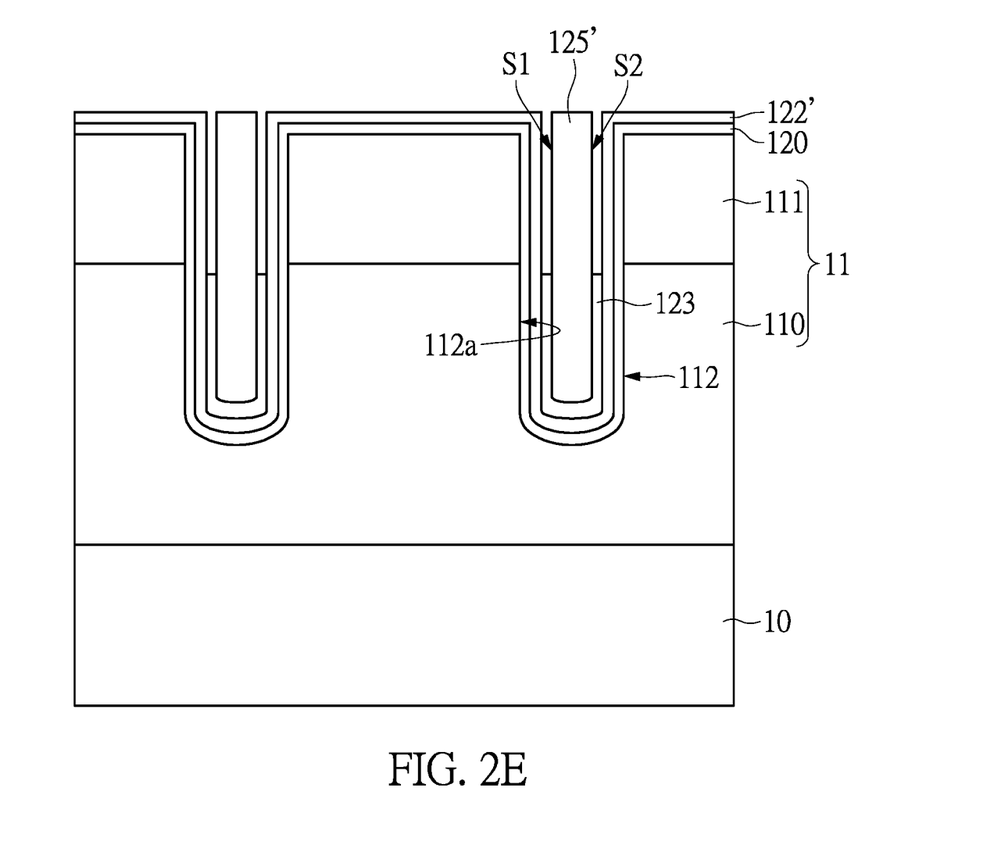

Referring to FIG. 2E, the second initial dielectric layer 123' at the upper part of the trench 112 is removed. In particular, the second initial dielectric layer 123' on the epitaxial layer 11 and at the upper part of the trench 112 is removed to form a second dielectric layer 123 at the lower part of the trench 112.

In one embodiment, a part of the second initial dielectric layer 123' can be removed by wet etching. It is worth noting that the second initial dielectric layer 123' and the first heavily doped semiconductor structure 125' are provided with the high etch selectivity, and therefore the first heavily doped semiconductor structure 125' is used as a mask when eliminating the second initial dielectric layer 123' at the upper part of the trench 112.

In addition, the high etch selectivity also exists between the second initial dielectric layer 123' and the first initial dielectric layer 122'. Therefore, the first initial dielectric layer 122' is retained to protect the gate insulating layer 120 when the second initial dielectric layer 123' at the upper part of the trench 112 is etched.

Figure 2F:
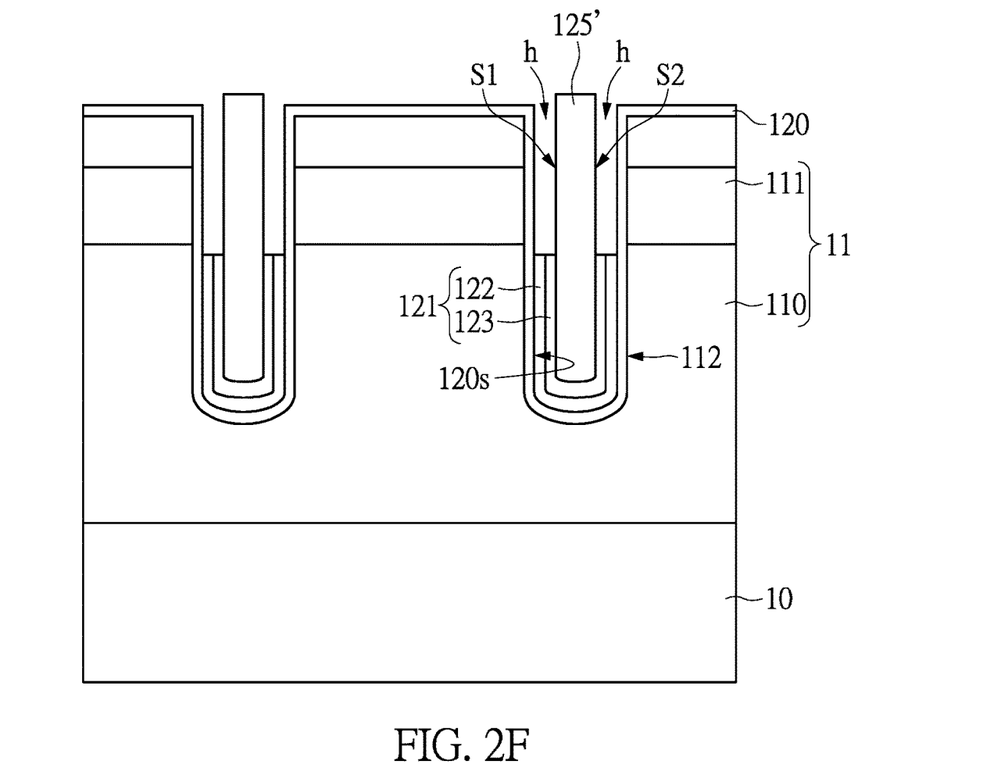

Afterwards, as shown in FIG. 2F, the first initial dielectric layer 122' at the upper part of the trench 112 is removed to form the laminated layer 121 at the lower part of the trench 112.

In detail, the first initial dielectric layer 122' on the epitaxial layer 11 and at the upper part of the trench 112 will be removed, so that the first dielectric layer 122 is formed at the lower part of the trench 122.

Similarly, the first heavily doped semiconductor structure 125' and the second initial dielectric layer 123 are used as a mask when eliminating a part of the first initial dielectric layer 122' by the etch process. On the other hand, since the first initial dielectric layer 122' and the gate insulating layer 120 are provided with the high etch selectivity therebetween, the gate insulating layer 120 will be retained during the elimination of the part of the first initial dielectric layer 122'.

In sum, after removing the parts of the first initial dielectric layer 122' and the second initial dielectric layer 123', the laminated layer 121 is formed at the lower part of the trench 112. The laminated layer 121 covers the lower part of the inner surface 120s of the gate insulating layer 120, and includes the first dielectric layer 122 and the second dielectric layer 123. In the present embodiment, the top of the laminated layer 121 is lower than the bottommost edge of the body region 111, that is, lower than the level of the lowest point of the body region 111.

In addition, as shown in FIG. 2F, after removing the parts of the first initial dielectric layer 122' and the second initial dielectric layer 123', the upper part of the inner surface 120s of the gate insulating layer 120, a part of the first side S1 and a part of the second side S2 of the first heavily doped semiconductor structure 125' are exposed. In other words, two grooves h are formed by individually removing the upper part of the first initial dielectric layer 122' and the upper part of the second initial dielectric layer 123'. The two grooves h are disposed respectively between the gate insulating layer 120 and the first side S1, and between the gate insulating layer 120 and the second side S2.

Figure 2G:
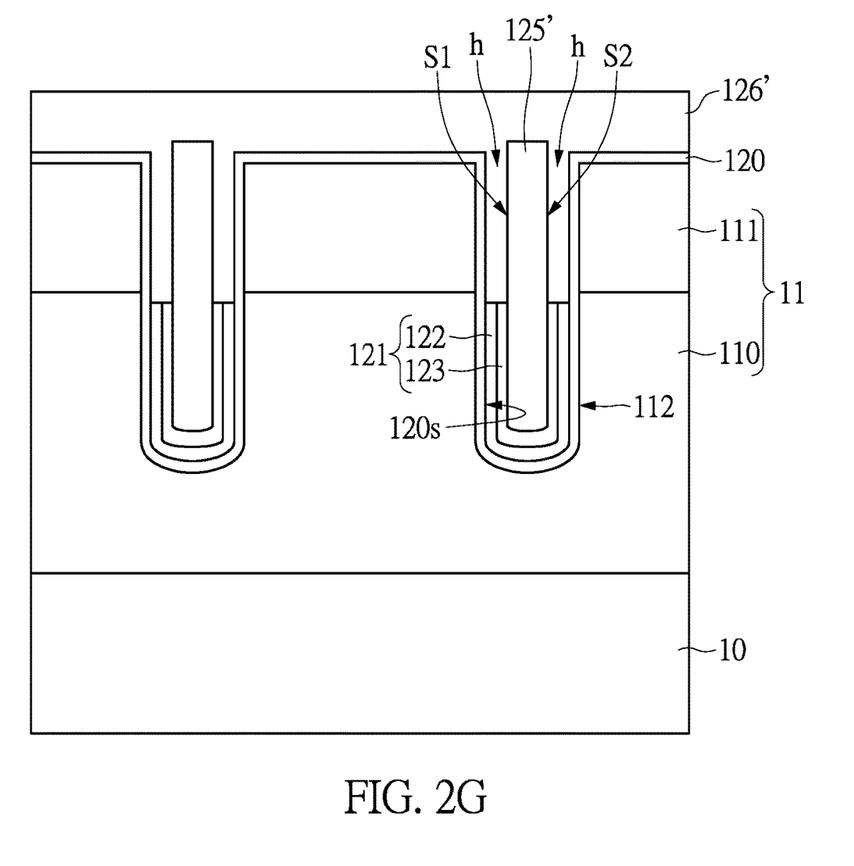

Referring to FIG. 2G, the second conductive semiconductor material 126' is formed to completely cover the first heavily doped semiconductor structure 125' and the gate insulating layer 120, as well as to fill into the two grooves h.

The second conductive semiconductor material 126' contains the second conductive impurity, which can be N-type impurities or P-type impurities. The second conductive semiconductor material 126' can be doped poly-Si. When the trench power semiconductor device is N-type MOSFET, the second conductive semiconductor material 126' is doped with N-type impurities; when the trench power semiconductor device is P-type MOSFET, the second conductive semiconductor material 126' is doped with P-type impurities. That is, the conductive type of the second conductive semiconductor material 126' is opposite to the conductive type of the body region 111 and the first heavily doped semiconductor structure 125'. In one embodiment, the second conductive semiconductor material 126' can be formed by performing the in-situ doping CVD process.

Figure 2H:
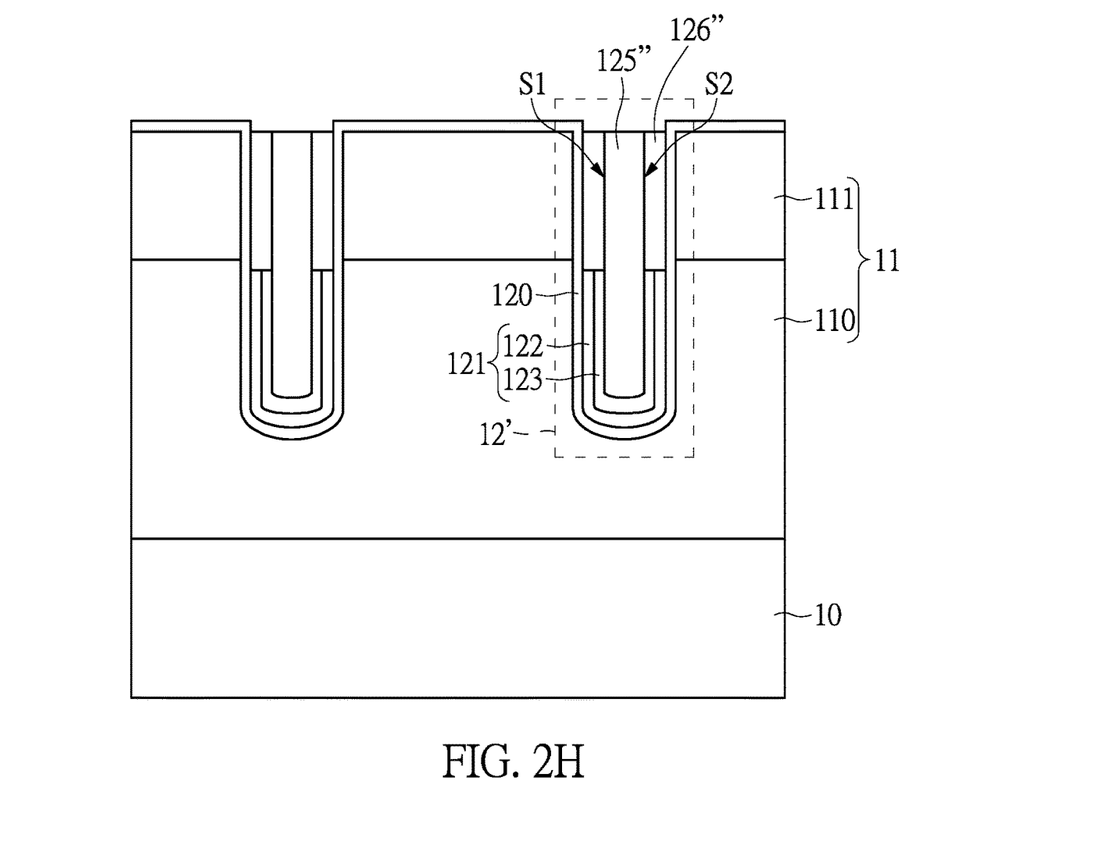

Afterwards, referring to FIG. 2H, the second conductive semiconductor material 126' on the epitaxial layer 11 is removed by etching back, so that each of the two second heavily doped semiconductor structures 126" is formed respectively in each of the two grooves h. The initial gate structure 12' is formed through the aforementioned steps.

Then, referring to FIG. 1 again, a doping process is performed in step S104, in which a second conductive impurity is additively implanted into the body region to form a first surface doped region and to form a second surface doped region on the top of the first heavily doped semiconductor structure simultaneously.

Figure 2I:
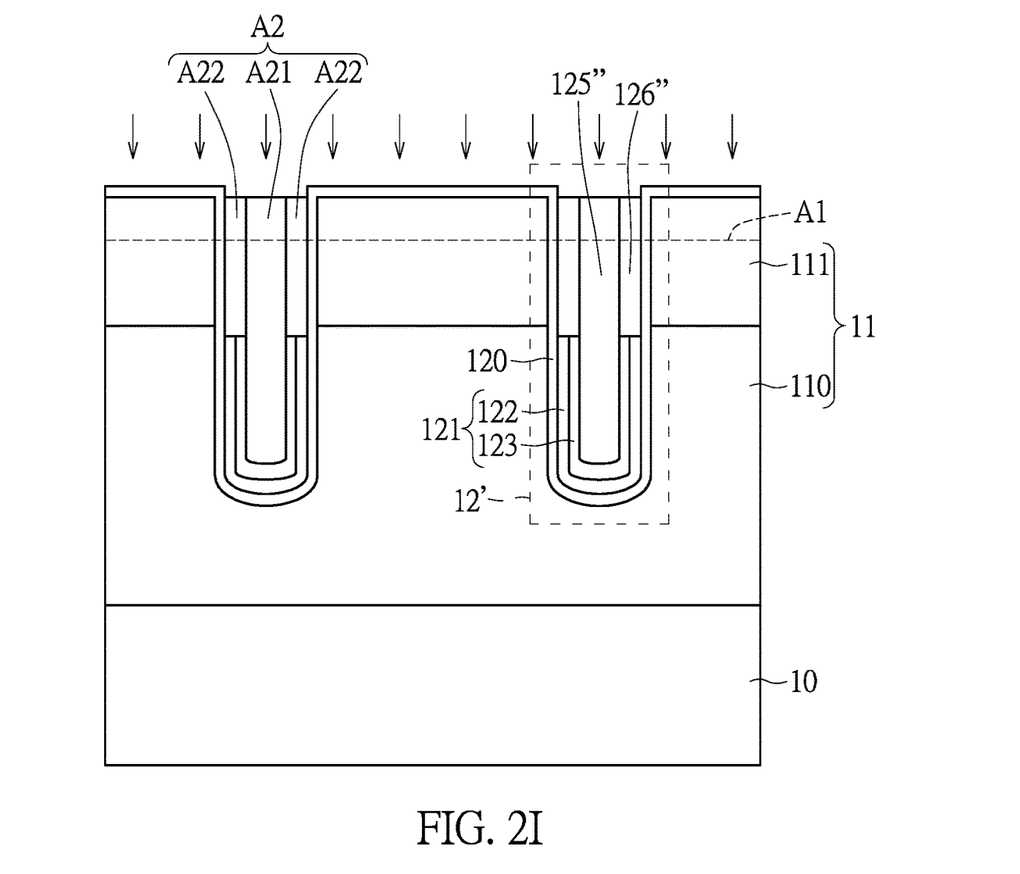

Particularly, in the present embodiment, the ion implantation is performed for the body region 111 and the initial gate structure 12' without using any masks. During the ion implantation, the second conductive impurity is implanted in the body region 111 and the initial gate structure 12', so as to form a first surface doped region A1 at the surface of the body region 111, and to form a second surface doped region A2 on the top of the first heavily doped semiconductor structure 125" and the top of the second heavily doped semiconductor structure 126" simultaneously.

The second surface doped region A2 includes a first region A21 of the first heavily doped semiconductor structure 125" and a second region A22 on the top of the two second heavily doped semiconductor structures 126".

It is worth noting that the first conductive impurity is already present in the first heavily doped semiconductor structure 125", and the concentration of the implanted second conductive impurity is much higher than the concentration of the first conductive impurity in the first heavily doped semiconductor structure 125" after implanting the second conductive impurity by the doping process. Therefore, the conductivity of the first region A21 is similar to the second conductive type, that is, the same conductive type as that of the second heavily doped semiconductor structure 126".

Then, the thermal diffusion process is performed in the step S105, so that the first surface doped region forms a source region and a gate is formed in the trench.

Figure 2J:
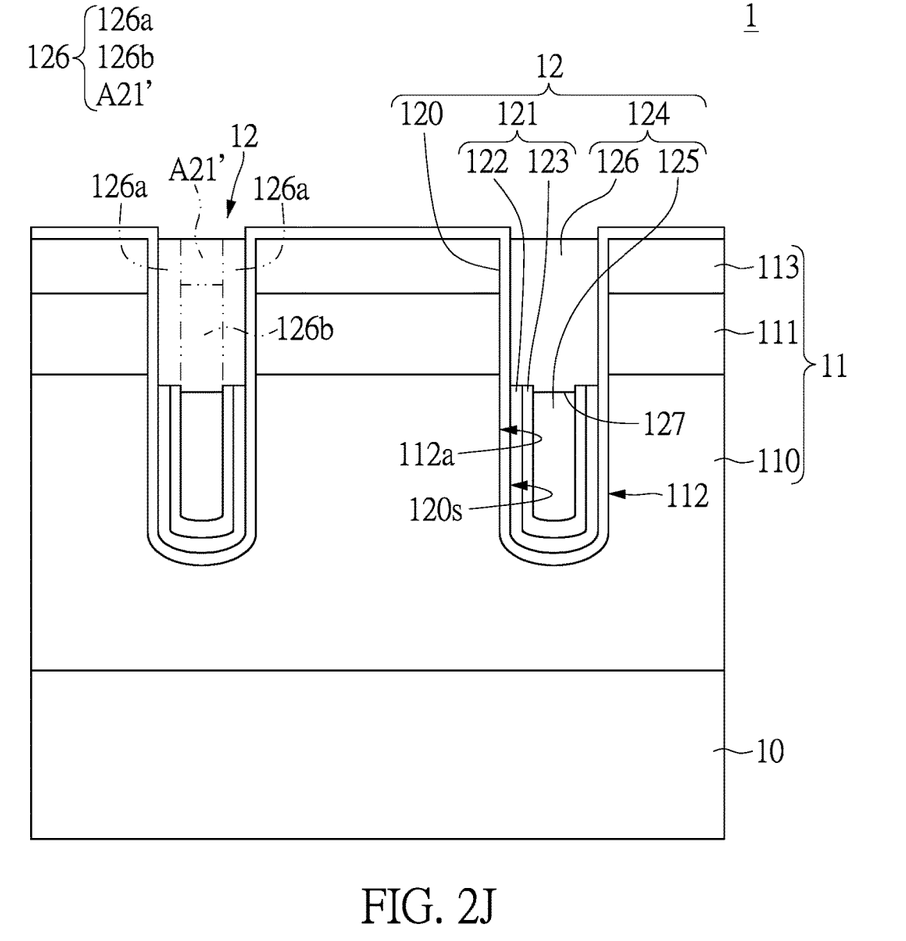

Referring to FIG. 2J, the gate 124 includes an upper doped region 126 and a lower doped region 125, a PN junction 127 is formed between the upper doped region 126 and the lower doped region 125, and the upper doped region 126 is formed through the diffusion of the second conductive impurity in the second surface doped region A2 and the second heavily doped semiconductor structure 126". Accordingly, the upper doped region 126 has two lateral side portions 126a, a surface portion A21', and a central portion 126b. The central portion 126b is below the surface portion A21', and the surface portion A21' and the central portion 126b are located between the two lateral side portions 126a. Since the second conductive impurities diffuse from the second doped region A2 and the second heavily doped semiconductor structure 126" toward the first heavily doped semiconductor structure 125" during the thermal diffusion process, the concentrations of the second conductive impurities at the lateral side portions 126a and at the surface portion A21' are higher than that at the central portion 126b of the upper doped region 126.

It is worth noting that the heating temperature and the heating time should be controlled during the thermal diffusion process to prevent the second conductive impurity from diffusing to the lower part of the first heavily doped semiconductor structure 125", which leads to the PN junction 127 being unable to be formed in the gate 124 and affects the electrical characteristics of the trench power semiconductor device 1. In one embodiment, the second conductive impurity is diffused through the rapid thermal diffusion process.

That is, the lower part of the first heavily doped semiconductor structure 125" forms the aforementioned lower doped region 125. Accordingly, after performing the thermal diffusion process, the source region 113 formed in the body region 111, and the upper doped region 126 and lower doped region 125 of the gate 124 formed in the trench 112, can be obtained simultaneously.

Though the first surface doped region A1 and the second surface doped region A2 have approximately the same depths before performing the thermal diffusion process, the diffusing rate of the second conductive impurity in the first surface doped region A1 is smaller than that of the second conductive impurity in the second surface doped region A2 during the thermal diffusion process. Therefore, the position of the PN junction 127 formed between the upper doped region 126 and the lower doped region 125 is lower than the level of the lowest point of the body region 111. Moreover, in one embodiment, the position of the PN junction 127 is lower than the top of the laminated layer 121.

Figure 3:
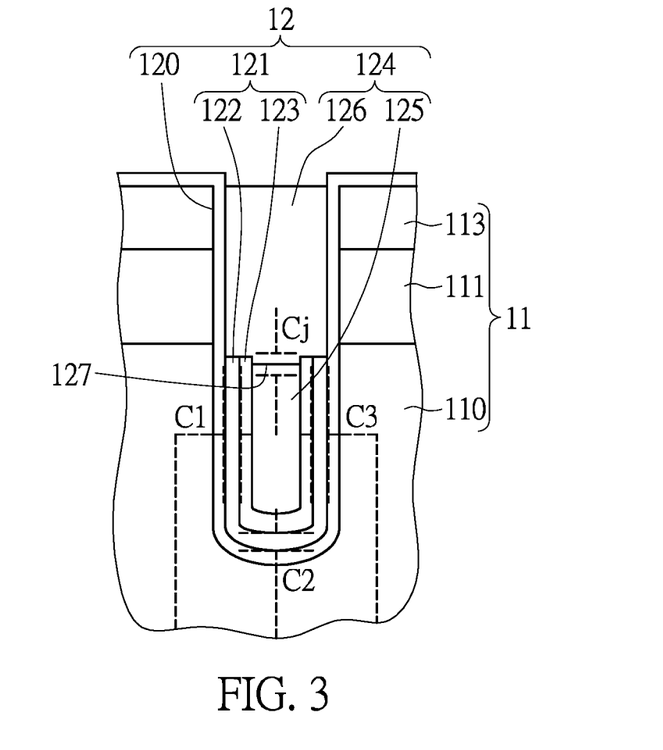
FIG. 3 is a local sectional view of the trench power semiconductor device according to an exemplary embodiment of the present disclosure.

Referring to FIGS. 2J and 3, FIG. 3 shows the local sectional view of the trench power semiconductor device according to an exemplary embodiment of the present disclosure.

The trench power semiconductor device 1 includes the substrate 10, the epitaxial layer 11 and the gate structure 12. The gate structure 12 is disposed in the trench 112 of the epitaxial layer 11, and includes the gate insulating layer 120, the laminated layer 121 and the gate 124. In addition, the gate 124 is separated from the laminated layer 121 and the epitaxial layer 11 by the gate insulating layer 120.

As mentioned above, the laminated layer 121 covers the gate insulating layer 120 corresponding to the lower part of the trench 112, and includes the first dielectric layer 122 and the second dielectric layer 123. Since the first dielectric layer 122 and the second dielectric layer 123 are formed by etching the first initial dielectric layer 122' and the second initial dielectric layer 123', respectively, the first dielectric layer 122 and the second dielectric layer 123 are also provided with a high etch selectivity therebetween. In one embodiment, the materials of which the first dielectric layer 122 is composed and the second dielectric layer 123 is composed can be respectively silicon nitride and silicon oxide.

The gate 124 includes the lower doped region 125 surrounded by the laminated layer 121, and the upper doped region 126 on the laminated layer 121 and the lower doped region 125, and the PN junction 127 is formed between the lower doped region 125 and the upper doped region 126. Since the upper doped region 126 is formed through the diffusion of the second conductive impurity in the second surface doped region A2 and the second heavily doped semiconductor structure 126", the second conductive impurity concentration in the upper doped region 126 decreases along the direction from the peripheral portion (that includes the two lateral side portions 126a and the surface portion A21') of the upper doped region 126 to the central portion 126b thereof.

Moreover, the trench power semiconductor device 1 has the body region 111 and the source region 113. The body region 111 is disposed in the epitaxial layer 11, and is adjacent to the upper part of the gate structure 12; the source region 113 is disposed on the body region 111, and is adjacent to the upper part of the gate structure 12. The level of the bottommost edge of the body region 111 is higher than the top of the laminated layer 121. In other words, the top of the laminated layer 121 is beneath the bottommost edge of the body region 111.

In accordance with the embodiment of the present disclosure, the gate structure 12 may extend from the surface of the epitaxial layer 11 into the drift region 110 because the trench 112 is a deep trench. Therefore, the aforementioned deep trench structure helps increase the breakdown voltage of the trench power semiconductor device 1, while increasing the parasitic capacitance (Cp) between the gate and drain.

As shown in FIG. 3, the parasitic capacitance (Cp) between the gate 124 and the drain is caused by connecting the first capacitance (C1), the second capacitance (C2) and the third capacitance (C3) in parallel, the value of the parasitic capacitance (Cp) is equivalent to a sum of the values of the first capacitor C1, the second capacitor (C2) and the third capacitor (C3), i.e., Cp=C1+C2+C3.

As mentioned previously, the switching speed of the trench power semiconductor device 1 may be attenuated due to an excessive parasitic capacitance (Cp). Accordingly, the PN junction 127 is formed in the gate 124 in the embodiment of the present disclosure. Since the junction capacitance (Cj) of the PN junction 127 is generated under reverse bias, and the junction capacitance (Cj) is in series with the parasitic capacitance (Cp), the effective capacitance (Cgd) of gate-to-drain, parasitic capacitance (Cp) and the junction capacitance (Cj) is equivalent to the following relation: Cgd= (Cp*Cj)/(Cp+Cj). Since the value of the effective capacitance (Cgd) of gate-to-drain is smaller than that of the parasitic capacitance (Cp), the switching loss of the trench power semiconductor device 1 can be reduced.

In addition, in order to generate the junction capacitance (Cj) at the PN junction 127 of the gate 124 when the trench power semiconductor device 1 is in the conducting (ON) state, the conductive type of the impurities in the upper doped region 126 is the same as that of the impurities in the source region 113, whereas different from that of the impurities in the body region 111. Taking the N-type trench power MOSFET as an example, both of the source region 113 and the upper doped region 126 are doped with N-type conductive impurities, whereas both of the body region 111 and the lower portion 125 are doped with P-type conductive impurities.

When a positive bias is applied to the upper doped region 126 of the gate 124, the electrons in the body region 111 are accumulated at the side walls of the trench 112 and form a channel between the source and the drain so that the trench power semiconductor device 1 is at the conducting (ON) state.

However, a depletion region caused by reverse bias at the PN junction 127 of the gate 124 decreases the effective capacitance (Cgd) of gate-to-drain. On the contrary, taking the P-type trench power MOSFET for example, both of the source region 113 and the upper doped region 126 are doped with P-type conductive impurities, whereas both of the body region 111 and the lower doped portion 125 are doped with N-type conductive impurities.

In summary, in the trench power semiconductor device and the manufacturing method thereof in accordance with the present disclosure, a PN junction is formed in the gate. Since a junction capacitance (Cj) of the PN junction is generated under reverse bias, and the junction capacitance is in series with the parasitic capacitance (Cp) between the gate and the drain, the effective capacitance (Cgd) of gate-to-drain can be reduced.

On the other hand, in the manufacturing method of the trench power semiconductor device, the body thermal diffusion process of the body region is performed before the step of the formation of the initial gate structure. Then, structures in the trench are doped during performing of the source doping process. Afterwards, the thermal diffusion process is performed, so as to simultaneously form the source region and the gate with a PN junction. Therefore, the diffusion of the conductive impurities in the upper doped region and the lower doped region of the gate, which causes the lack of the PN junction in the gate and poor characteristics of devices due to repeated thermal diffusion processes, can be prevented.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

The abovementioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A trench power semiconductor device, comprising:
   a substrate;
   an epitaxial layer, disposed on the substrate and having a trench; and
   a gate structure, disposed in the trench, and including:
   a gate insulating layer, covering the trench;
   a laminated layer, covering the gate insulating layer corresponding to the lower part of the trench; and
   a gate, disposed in the trench and being separated from the epitaxial layer by the gate insulating layer and the laminated layer;
   wherein the gate includes a lower doped region of a first conductive type surrounded by the laminated layer and an upper doped region of a second conductive type disposed on the laminated layer and the lower doped region, a PN junction being formed between the lower doped region and the upper doped region, and wherein the lower doped region contains first conductive impurities and the upper doped region contains second conductive impurities;
   wherein the upper doped region has two lateral side portions, a surface portion, and a central portion that is below the surface portion, the surface portion and the central portion are located between the two lateral side portions, and concentrations of the second conductive impurities at the lateral side portions and at the surface portion are higher than that at the central portion of the upper doped region.

2. The trench power semiconductor device according to claim 1, further comprising:
   a body region, disposed in the epitaxial layer and adjacent to the upper part of the gate structure; and
   a source region, disposed in the epitaxial layer and adjacent to the upper part of the gate structure, wherein the source region is on the body region and the PN junction is lower than the lowest point of the body region.

3. The trench power semiconductor device according to claim 2, wherein the top of the laminated layer is lower than the bottommost edge of the body region.

4. The trench power semiconductor device according to claim 1, wherein the laminated layer includes a first dielectric layer and a second dielectric layer disposed between the gate insulating layer and the lower doped region, and wherein the materials of which the first dielectric layer is composed are different from the materials of which the second dielectric layer and the gate insulating layer are composed.

5. The trench power semiconductor device according to claim 4, wherein the first dielectric layer and the second dielectric layer are silicon nitride and silicon oxide, respectively.

* * * * *